(12) United States Patent
Phillips et al.

(10) Patent No.: US 7,912,431 B2
(45) Date of Patent: *Mar. 22, 2011

(54) SIGNAL AMPLIFIERS HAVING NON-INTERRUPTIBLE COMMUNICATION PATHS

(75) Inventors: Neil P. Phillips, Dove Canyon, CA (US); Sou-Pen Su, Atlanta, GA (US); Fu-Chin Shen, Keelung (TW)

(73) Assignee: CommScope, Inc. of North Carolina, Hickory, NC (US)

( * ) Notice: Subject to any disclaimer, the term of this patent is extended or adjusted under 35 U.S.C. 154(b) by 145 days.

This patent is subject to a terminal disclaimer.

(21) Appl. No.: 12/208,675

(22) Filed: Sep. 11, 2008

(65) Prior Publication Data

US 2009/0047917 A1 Feb. 19, 2009

Related U.S. Application Data

(63) Continuation-in-part of application No. 11/077,802, filed on Mar. 10, 2005, now abandoned.

(51) Int. Cl.
*H04B 1/04* (2006.01)
(52) U.S. Cl. ............ 455/127.1; 455/127.2; 455/83; 455/572
(58) Field of Classification Search ............ 455/82, 455/572, 73, 108, 24, 102, 126, 78, 79, 127.1, 455/81, 127.2, 83, 127.3, 574; 333/126, 333/127
See application file for complete search history.

(56) References Cited

U.S. PATENT DOCUMENTS

| | | |
|---|---|---|
| 5,016,244 A | 5/1991 | Massey, Jr. et al. |
| 5,696,895 A | 12/1997 | Hemphill et al. |
| 6,075,784 A | 6/2000 | Frankel et al. |
| 6,175,565 B1 | 1/2001 | McKinnon et al. |
| 6,202,169 B1 | 3/2001 | Razzaghe-Ashrafi et al. |
| 6,373,817 B1 | 4/2002 | Kung et al. |

(Continued)

FOREIGN PATENT DOCUMENTS

JP 2004-80483 3/2004

(Continued)

OTHER PUBLICATIONS

"Clipcomm CP-100P," VOIPSupply.com; http://www.voipsupply.com/product_info.php?products_id=305, 2 pages printed from Internet Jun. 6, 2005.

(Continued)

*Primary Examiner* — John Lee
(74) *Attorney, Agent, or Firm* — Myers Bigel Sibley & Sajovec

(57) ABSTRACT

RF signal amplifiers are provided that include an RF input port, a first RF output port, a second RF output port and a power input for receiving electrical power. These amplifiers include a first communication path between the RF input port and the first RF output port that has a power amplifier that amplifies signals that are transmitted from the RF input port to the first RF output port. These amplifiers also have a second non-interruptible communication path between the RF input port and the second RF output port. The amplifiers further include a selective termination circuit that is configured to pass signals between the RF input port and the first RF output port over the first communication path when electrical power is received at the power input and to terminate the first communication path to a matched termination when an electrical power feed to the power input is interrupted.

26 Claims, 13 Drawing Sheets

U.S. PATENT DOCUMENTS

| | | |
|---|---|---|
| 6,477,197 B1 | 11/2002 | Unger |
| 6,640,239 B1 | 10/2003 | Gidwani |
| 6,671,253 B1 | 12/2003 | Alexander, Jr. et al. |
| 6,690,789 B1 | 2/2004 | Hamilton |
| 6,735,302 B1 | 5/2004 | Caine et al. |
| 6,785,907 B1 | 8/2004 | Dan et al. |
| 6,839,829 B1 | 1/2005 | Daruwalla et al. |
| 6,980,643 B2 * | 12/2005 | Chen et al. ............... 379/377 |
| 2002/0101817 A1 | 8/2002 | Teixeira |
| 2002/0101818 A1 | 8/2002 | Teixeira |
| 2003/0066082 A1 | 4/2003 | Kliger et al. |
| 2003/0214939 A1 | 11/2003 | Eldumiati et al. |
| 2003/0223750 A1 | 12/2003 | Farmer et al. |
| 2004/0027992 A1 | 2/2004 | Volkening et al. |
| 2004/0170160 A1 | 9/2004 | Li et al. |
| 2005/0014472 A1 | 1/2005 | Cox et al. |
| 2005/0026571 A1 * | 2/2005 | Yang et al. .................. 455/78 |
| 2005/0068223 A1 | 3/2005 | Vavik |
| 2005/0169056 A1 | 8/2005 | Berkman et al. |
| 2006/0015921 A1 | 1/2006 | Vaughan |
| 2006/0205442 A1 | 9/2006 | Phillips |
| 2007/0165611 A1 * | 7/2007 | Yang et al. .................. 370/356 |
| 2008/0112392 A1 * | 5/2008 | Mansfield ................... 370/352 |

FOREIGN PATENT DOCUMENTS

| | | |
|---|---|---|
| JP | 2005-5875 | 1/2005 |

OTHER PUBLICATIONS

"VOIP/PSTN 2-Line Intelligent Switch (Gateway/Phone/ATA)," eBay.com http://cgi.ebay.com/ws/eBayISAPI.dlIZViewItem&item = 5193203853&category = 11188, 7 pages printed from Internet on Jun. 6, 2005.

"Epygi Quadro 16x #16209, "The VOIPConnection.com http://www.thevoipconnection.com/store/customer/product.php-?productid=16209&cat=255&page= 1, 2 pages printed from Internet on Jun. 6, 2005.

Electroline: "Drop Amplifiers"; information from website www.electroline.com; 13 pgs. (Apr. 26, 2005), Admitted Prior Art.

Antronix; "Amplifiers: Residential Amplifiers"; information from website www.antronix.net; 2 pgs. (Apr. 26, 2005) Admitted Prior Art.

Andes, Inc.' "Amplifiers"; information from website; 10 pgs. (Apr. 26, 2005), Admitted Prior Art.

Extreme Broadband Engineering; "Subscriber Broadband Amplifiers"; 6 pgs. (Apr. 26, 2005), Admitted Prior Art.

Antronix; "Amplifiers: Residential Amplifiers"; information from website www.antronix.net; 2 pgs. (Mar. 19, 2008), Admitted Prior Art.

Extreme Broadband Engineering; "Infinity Premise System"; information from website www.extreme-broadband.com 5 pgs. (Mar. 19, 2008), Admitted Prior Art.

Andes, Inc. "Amplifiers" information from website; 13 pgs. (Mar. 19, 2008), Admitted Prior Art.

Electroline: "Drop Amplifiers"; information from website www.electroline.com; 8 pgs. (Mar. 19, 2008).

Admitted Prior Art.

U.S. Appl. No. 11/182,738.

Antronix Product Overview: ARA4-7B1/AC Advanced Residential Amplifier Bypass Port, www.antronix.net, Jul. 2005.

"Clipcomm CP-100P, " VOIPSupply.com; http://www.voipsupply.com/product_info.php?products_id=305, 2 pages printed from Internet Jun. 6, 2005.

"VOIP/PSTN 2-Line Intelligent Switch (Gateway/Phone/ATA)," eBay.com http://cgi.ebay.com/ws/eBay/ISAPI.dlIZViewItem&item=5193203853&category=11188, 7 pages printed from Internet on Jun. 6, 2005.

"Epygi Quadro 16x #16209, "The VOIPConnection.com http://www.thevoipconnection.com/store/customer/product.php-?productid=16209&cat=255&page=1, 2 pages printed from Internet on Jun. 6, 2005.

* cited by examiner

US 7,912,431 B2

SIGNAL AMPLIFIERS HAVING NON-INTERRUPTIBLE COMMUNICATION PATHS

CROSS-REFERENCE TO RELATED APPLICATION

This application claims priority under 35 U.S.C. §120 as a continuation-in-part application from U.S. patent application Ser. No. 11/077,802, filed Mar. 10, 2005 now abandoned, the disclosure of which is hereby incorporated by reference herein in its entirety.

FIELD OF THE INVENTION

The present invention is directed to technology for providing non-interruptible communication.

BACKGROUND

In recent years, the rise of the Internet and other online communication methods have rapidly transformed the manner in which electronic communications take place. Today, rather than relying on prior-generation switched telephone communication arrangements, many service providers are turning to modern Internet Protocol (IP) based communication networks. Such networks can provide flexibility in facilitating the transmission of voice, data, video, and other information at great speeds.

As a result, many consumers now have the option of conducting telephone conversations, receiving and sending information for interactive video, and communicating over the Internet—all through a single RF connection with the consumer's service provider. However, in order to support these various services, the RF signal received from the service provider (approximately 5 dBmV/channel) may require amplification by an RF amplifier in order to properly service the various communication ports maintained by a consumer.

Unfortunately, if power to the RF amplifier is interrupted, some or all of these services may become unavailable. Although such interruptions may be tolerated by consumers in relation to certain non-essential services, interruptions to other services may be unacceptable. For example, consumers relying on IP-based emergency communications (i.e., 911 service) can be left without such services during power interruptions.

In order to remedy this problem, some consumers may be inclined to acquire a dedicated switched telephone line to provide emergency services during power interruptions. Nevertheless, such an option can require the consumer to incur additional costs and fails to capitalize on the advantages offered by IP-based communication.

SUMMARY

Pursuant to embodiments of the present invention, bi-directional RF signal amplifiers are provided that include an RF input port, a first RF output port, a second RF output port and a power input for receiving electrical power. These amplifiers include a first communication path between the RF input port and the first RF output port. The first communication path includes a power amplifier that amplifies signals that are transmitted from the RF input port to the first RF output port. The bi-directional RF signal amplifiers also have a second non-interruptible communication path between the RF input port and the second RF output port and a selective termination circuit. The selective termination circuit is configured to pass signals between the RF input port and the first RF output port over the first communication path when electrical power is received at the power input, and to terminate the first communication path to a matched termination when electrical power to the power input is interrupted.

In some embodiments, the selective termination circuit may comprise a relay having an input terminal, a first output terminal and a second output terminal. The first output terminal of the relay is coupled to the first communication path and the second output terminal of the relay is connected to the matched termination. The bi-directional RF signal amplifiers may further include a directional coupler having an input that is connected to the RF input port, a first output that is connected to the input terminal of the relay and a second output that is connected to the second non-interruptible communication path. The matched termination may be a resistor that is terminated to a ground voltage. The bi-directional RF signal amplifiers may also include a power regulation circuit that receives electrical power from the power input and that outputs a power supply voltage to the power amplifier and to the relay.

In some embodiments, the first communication path includes a forward path from the RF input port to the first RF output port and a reverse path from the first RF output port to the RF input port. The reverse path may include a second power amplifier. Additionally, the first communication path may include a first diplexer that is between the first output terminal of the relay and the first power amplifier and a second diplexer that is between the first power amplifier and the first RF output port. The bi-directional RF signal amplifiers may also include a power dividing circuit having an input and a plurality of outputs that is between the second diplexer and the first RF output port. In some embodiments, a power passing path may be provided between the RF input port and the second RF output port.

According to further embodiments of the present invention, RF signal amplifiers are provided that comprise an RF input port, a first RF output port and a second RF output port. These RF signal amplifiers further include a relay and a directional coupler having an input that is connected to the RF input port, a first output that is connected to an input terminal of the relay and a second output that is connected to the second RF output port. A power amplifier is provided between a first output terminal of the relay and the first RF output port. Finally, these amplifiers include a resistive termination that is coupled to a second output terminal of the relay.

Pursuant to still further embodiments of the present invention, methods of providing a non-interruptible communication path through a signal amplifier that includes an RF input port and multiple RF output ports are provided. Pursuant to these methods, a directional coupler is used to split a signal received at the RF input port into a first signal component and a second signal component. The first signal component is passed to a first of the output ports via a first communication path that includes an amplifier. The second signal component is passed to a second of the output ports via a second non-interruptible communication path. The first signal component is then passed to a matched resistive termination in response to interruption of an electrical power feed to the signal amplifier.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", etc.).

In accordance with various embodiments set forth in the present disclosure, a bi-directional RF signal amplifier can be provided with a non-interruptible communication port for maintaining communication in the event of power failure. In various embodiments, the amplifier may receive RF signals from a service provider or any other appropriate signal source through an input port.

For example, in residential applications, an amplifier in accordance with various embodiments of the present disclosure may receive a composite RF signal of approximately 5 dBmV/channel in the range of approximately 5-1002 MHz comprising information for telephone, cable television (CATV), Internet, VoIP, and/or data communication from a service provider. The amplifier may increase the signal to a more useful level of approximately 20 dBmV/channel and pass the amplified signal to one or more devices in communication with the amplifier through various output ports. Such devices may include, but need not be limited to: televisions, modems, telephones, computers, and/or other communication devices known in the art. In the event of power failure, an unamplified signal may still be passed through a communication path between the service provider and the communication device.

Figure 1:
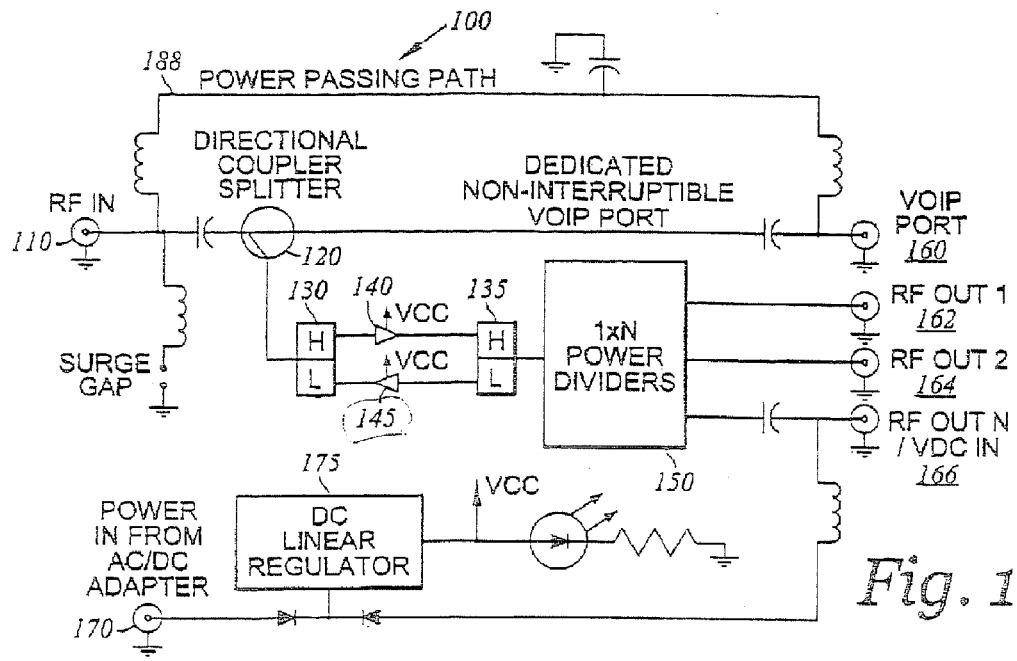
FIG. 1 is a block diagram of a bi-directional RF signal amplifier employing a directional coupler for facilitating a non-interruptible communication port, in accordance with embodiments of the present invention.
Figure 2:
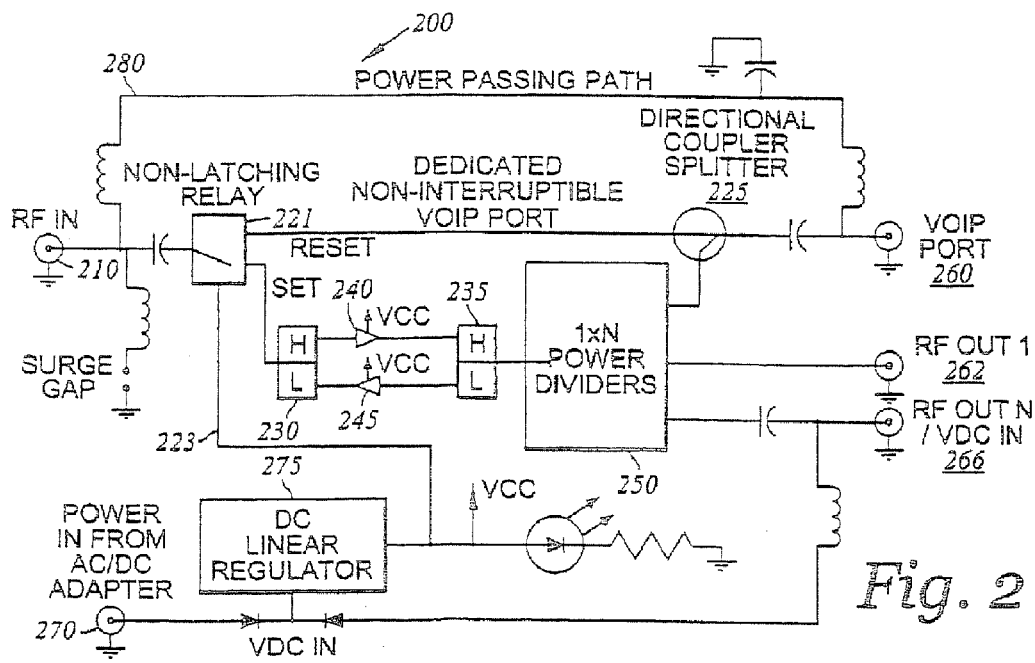
FIG. 2 is a block diagram of a bi-directional RF signal amplifier employing a non-latching relay and a directional coupler for facilitating a non-interruptible communication port, in accordance with embodiments of the present invention.
Figure 3A:
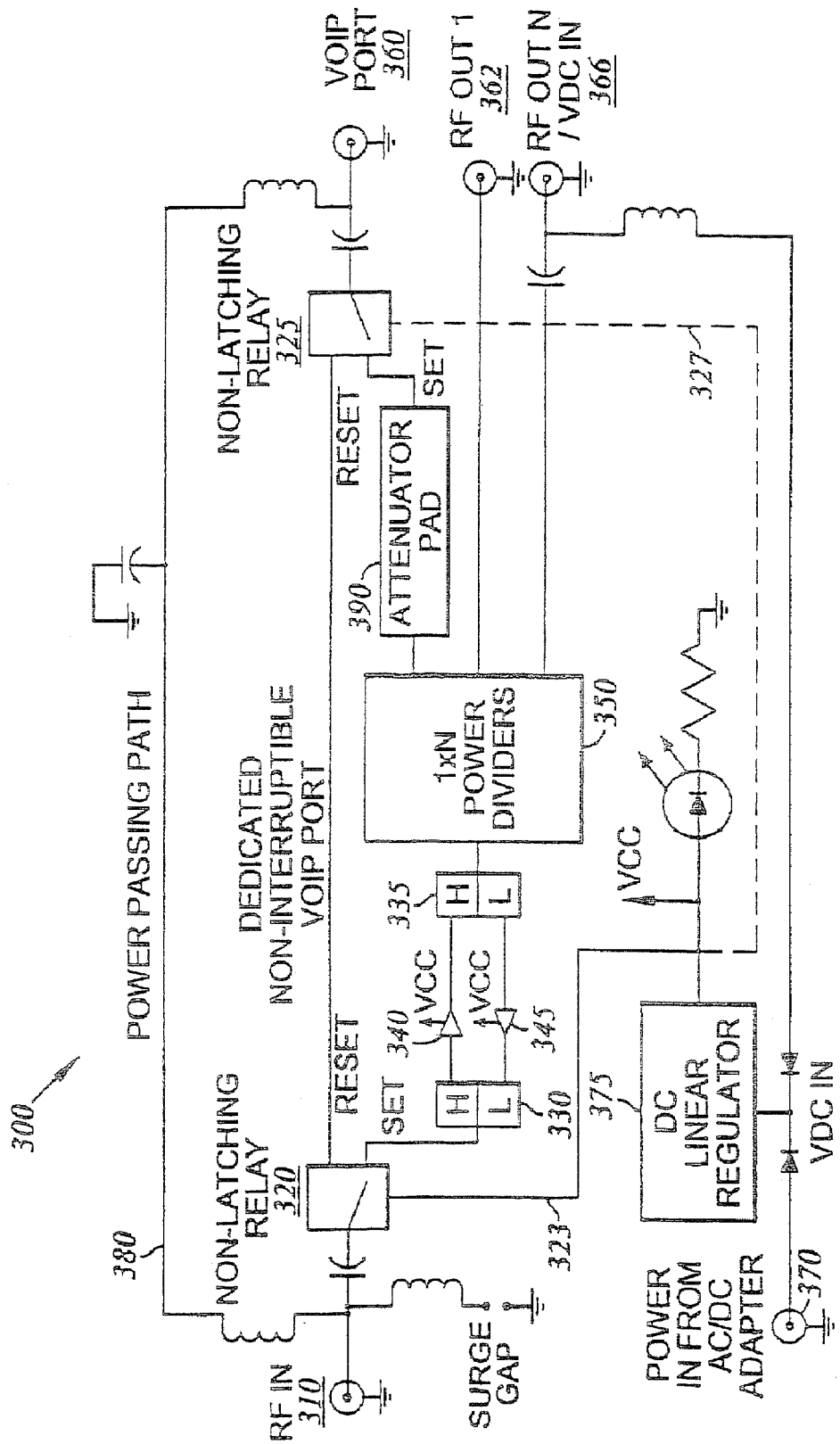
FIGS. 3a and 3b are block diagrams of bi-directional RF signal amplifiers employing a plurality of non-latching relays for facilitating a non-interruptible communication port, in accordance with embodiments of the present invention.

FIGS. 1, 2, 3a, 3b and 7 illustrate various embodiments of such an amplifier. Schematic representations of the embodiments of FIGS. 1, 2, and 3a are set forth in FIGS. 4a/4b, 5a/5b, and 6a/6b, respectively.

FIG. 1 illustrates a block diagram of a bi-directional RF signal amplifier 100 employing a directional coupler for facilitating a non-interruptible communication port 160. As illustrated, amplifier 100 can support a plurality of bi-directional communication ports for sending and receiving RF signals to and from a variety of signal sources and destinations.

A bi-directional RF input port 110 can be provided for receiving RF signals from a service provider, or any other appropriate signal source. Input port 110 can also pass output signals in the reverse direction from the amplifier 100 through the port 110 to the service provider or other signal source.

A plurality of bi-directional output ports 160, 162, 164, and 166 can also be provided by amplifier 100 for passing RF signals from the amplifier 100 to one or more devices in communication with the output ports, and vice versa. It will be appreciated that any appropriate device that may advantageously send and/or receive an RF signal may be placed in communication with one or more of the various output ports. For example, it is contemplated that telephone, CATV, Internet, VoIP, and/or data communication devices may be placed in such communication with a service provider where the amplifier 100 is installed in the residence of a subscriber. However, it will further be appreciated that any desired combination of these and/or other devices may be used where appropriate.

Signals received through input port 110 can be passed through a first communication path between input port 110 and output ports 162, 164, and/or 166. Specifically, the signals can be fed through a passive directional coupler 120 to a high/low diplexer 130 for separating the high frequency input signal from any low frequency output signal incident in the reverse direction. In various embodiments, diplexer 130 can filter the signals in a manner such that signals with frequencies greater than approximately 45-50 MHz are passed as high frequency input signals received from port 110, while signals with frequencies lower than such range are passed in the reverse direction as low frequency output signals received from ports 162, 164, or 166.

The high frequency input signals filtered by diplexer 130 can be amplified by individual amplifier 140, and passed to high/low diplexer 135 where they are combined with the output signals. The recombined signal can then be provided to power dividers 150, where it is distributed to any of ports 162, 164, and/or 166.

Turning now to the reverse signal flow through the first communication path of amplifier 100, signals received by the amplifier 100 from devices in communication with ports 162, 164, and/or 166 can be passed to power dividers 150 where they are combined into a composite output signal. The output signal can be fed through high/low diplexer 135 for separating the low frequency output signal from any high frequency input signal incident in the forward direction. As previously discussed in relation to diplexer 130, the diplexer 135 can filter the signals such that signals with frequencies greater than approximately 45-50 MHz are passed in the forward direction as high frequency signals received from port 110, while signals with frequencies lower than such range are passed in the reverse direction as low frequency signals received from ports 162, 164, and/or 166.

The low frequency output signals filtered by diplexer 135 can be amplified by individual amplifier 145, and passed to high/low diplexer 130 where they are combined with the input signals. In various embodiments, individual amplifier 145 can optionally be omitted from amplifier 100. The recombined signal can then be provided to coupler 120 where it is passed to port 110 for output to a service provider or other entity in communication with port 110.

As illustrated, amplifier 100 can further provide a power passing path 188, allowing power to be transmitted between ports 110 and 160.

During normal operation, the amplifier 100 can be powered from a power input port 170 and/or power that is reverse fed through RF OUT N/VDC IN port 166. In a typical installation at a subscriber's residence, it is contemplated that amplifier 100 may be powered by an AC/DC adapter receiving power provided by the residence (for example, 100-230 VAC, 50/60 Hz). As illustrated in FIG. 1, the power received from either power input can be provided to a voltage regulator 175 which supplies an operating voltage VCC to individual amplifiers 140 and/or 145.

In the event that power to voltage regulator 175 is interrupted, voltage regulator 175 will be unable to provide operating voltage VCC to individual amplifiers 140 and/or 145. As a result, individual amplifier 140 will not function to amplify the input signals received through port 110 for proper distribution to the various output ports 162, 164, and/or 166. Similarly, individual amplifier 145 also will not function to amplify the output signals received from ports 162, 164, and/or 166.

In response to this situation, amplifier 100 further provides a second communication path—a path between input port 110 and output port 160. In this regard, a dedicated non-interruptible port 160 can communicate with port 110 through coupler 120. Using this second communication path between ports 110 and 160 through coupler 120, signals can still be passed between a device in communication with port 160 and a service provider in communication with port 110. It will be appreciated that although the second communication path of amplifier 100 does not necessarily amplify the input or output signals, the path can nevertheless permit communication of at least one or more services, such as emergency 911 telephone service.

Figure 4A:
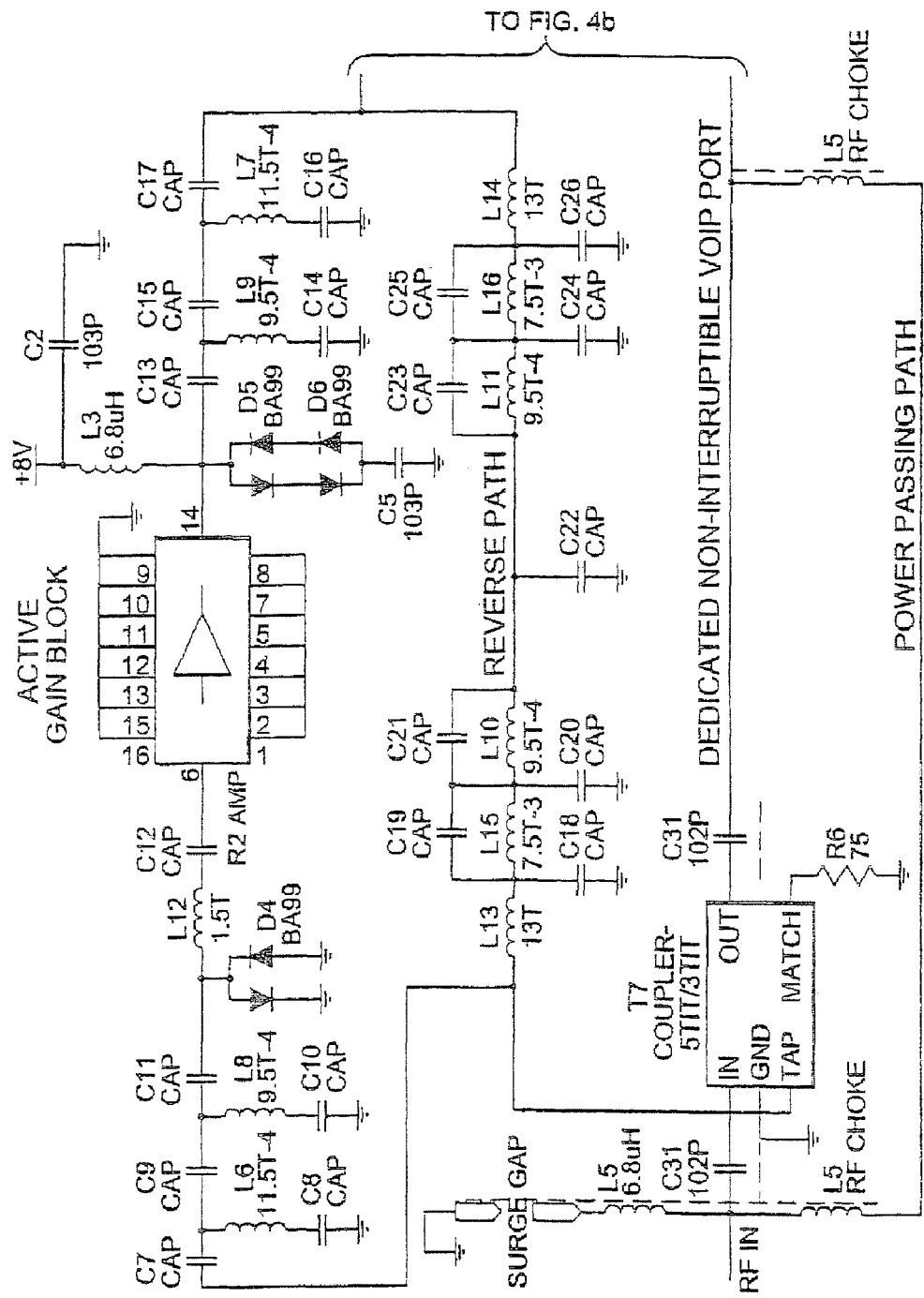
FIGS. 4a and 4b are a circuit schematic diagram of a bi-directional RF signal amplifier employing a directional coupler for facilitating a non-interruptible communication port, in accordance with embodiments of the present invention.
Figure 4B:
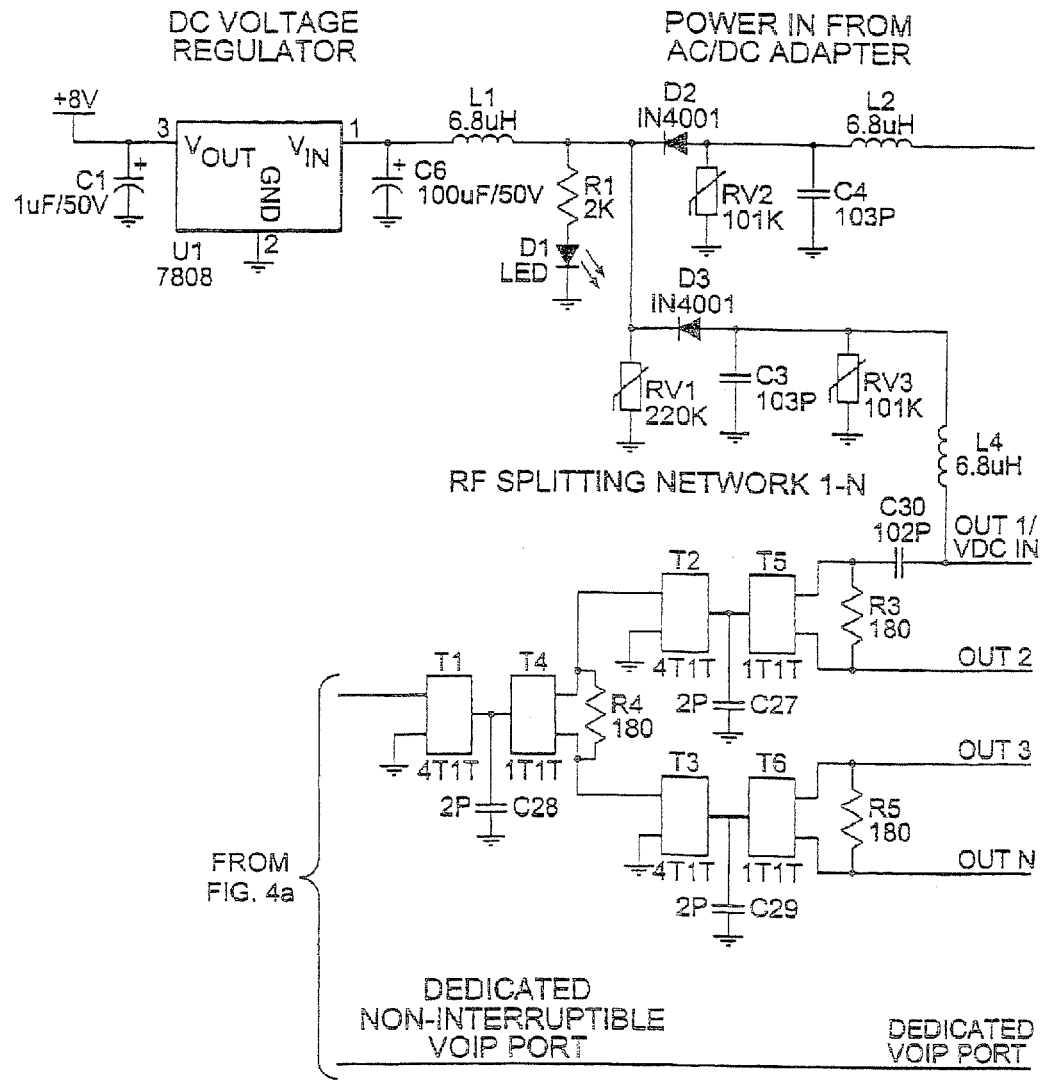

It will be appreciated that the use of the second communication path between ports 110 and 160 can provide a significant advantage in ensuring the availability of communication to at least one communication device in the event of power failure. A communication device in communication with port 160 (such as a VoIP compatible device, or other device) can further be provided with backup battery power to maintain the operation of the communication device. As discussed above, a schematic representation of the amplifier 100 of FIG. 1 is set forth in FIGS. 4a and 4b.

FIG. 2 illustrates a block diagram of a bi-directional RF signal amplifier 200 employing a non-latching relay 221 and a directional coupler 225 for maintaining a non-interruptible communication port 260. As illustrated, amplifier 200 can support a plurality of bi-directional communication ports for sending and receiving RF signals to and from a variety of signal sources and destinations.

Similar to amplifier 100 previously discussed herein, amplifier 200 includes a bi-directional RF input port 210 for receiving RF signals from a service provider, or any other appropriate signal source. Input port 210 can also pass output signals in the reverse direction from the amplifier 200 through the port 210 to the service provider or other signal source.

A plurality of bi-directional output ports 260, 262, and 266 can also be provided by amplifier 200 for passing RF signals from the amplifier 200 to one or more devices in communication with the output ports, and vice versa. Similar to amplifier 100, it will be appreciated that any appropriate device that may advantageously send and/or receive an RF signal may be placed in communication with one or more of the various output ports of amplifier 200. For example, it is contemplated that telephone, CATV, Internet, VoIP, and/or data communication devices may be placed in such communication where the amplifier 200 is installed in the residence of a subscriber. However, it will further be appreciated that any desired combination of these and/or other devices may be used where appropriate.

Signals received through input port 210 can be passed through a first communication path between input port 210 and output ports 260, 262, and/or 266. Specifically, the signals can be fed through a SPDT non-latching relay 221 to a high/low diplexer 230 for separating the high frequency input signal from any low frequency output signal incident in the reverse direction. In various embodiments, diplexer 230 can filter the signals in a manner such that signals with frequencies greater than approximately 45-50 MHz are passed as high frequency input signals received from input port 210, while signals with frequencies lower than such range are passed in the reverse direction as low frequency output signals received from ports 260, 262, or 266.

The high frequency input signals filtered by diplexer 230 can be amplified by individual amplifier 240, and passed to high/low diplexer 235 where they are combined with the output signals. The recombined signal can then be provided to power dividers 250, where it is distributed to any of ports 260, 262, and/or 266.

Turning now to the reverse signal flow through the first communication path of amplifier 200, signals received by the amplifier 200 from devices in communication with ports 262 and/or 266 can be passed to power dividers 250 where they are combined into a composite output signal. Signals received through port 260 can be passed to power dividers 250 through passive directional coupler 225 and also combined into the composite signal. The output signal can be fed through high/low diplexer 235 for separating the low frequency output signal from any high frequency input signal incident in the forward direction. As previously discussed in relation to diplexer 230, the diplexer 235 can filter the signals such that signals with frequencies greater than approximately 45-50 MHz are passed in the forward direction as high frequency signals received from port 210, while signals with frequencies lower than such range are passed in the reverse direction as low frequency signals received from ports 260, 262, and/or 266.

The low frequency output signals filtered by diplexer 235 can be amplified by individual amplifier 245, and passed to high/low diplexer 230 where they are combined with the input signals. In various embodiments, individual amplifier 245 can optionally be omitted from amplifier 200. The recombined signal can then be provided to non-latching relay 221 where it is passed to port 210 for output to a service provider or other entity in communication with port 210.

As illustrated, amplifier 200 can further provide a power passing path 280, allowing power to be transmitted between ports 210 and 260.

During normal operation, the amplifier 200 can be powered from a power input port 270 and/or power that is reverse fed through RF OUT N/VDC IN port 266. In a typical installation at a subscriber's residence, it is contemplated that amplifier 200 may be powered by an AC/DC adapter receiving power provided by the residence (for example, 100-230 VAC, 50/60 Hz). As illustrated in FIG. 2, the power received from either power input can be provided to a voltage regulator 275 which supplies an operating voltage VCC to individual amplifiers 240 and/or 245.

In the event that power to voltage regulator 275 is interrupted, voltage regulator 275 will be unable to provide operating voltage VCC to individual amplifiers 240 and/or 245. As a result, individual amplifier 240 will not function to amplify the input signals received through port 210 for proper distribution to the various output ports 260, 262, and/or 266. Similarly, individual amplifier 245 also will not function to amplify the output signals received from ports 260, 262, and/or 266.

Accordingly, amplifier 200 further provides a second communication path between input port 210 and output port 260. In this regard, a dedicated non-interruptible port 260 can communicate with port 210 through relay 221 and coupler 225. As illustrated, amplifier 200 provides a VCC path 223 to relay 221. When power (i.e. VCC) is interrupted, the relay 221 will be caused to switch from the normal signal path in the "set" position, to the non-interruptible signal path in the "reset" position or vice versa. As a result, using the non-interruptible signal path between ports 210 and 260 through relay 221 and coupler 225, signals can still be passed between a device in communication with port 260 and a service provider in communication with port 210. It will be appreciated that although the second communication path of amplifier 200 does not necessarily amplify the input or output signals, the path can nevertheless permit communication of at least one or more services, such as emergency 911 telephone service.

Figure 5A:
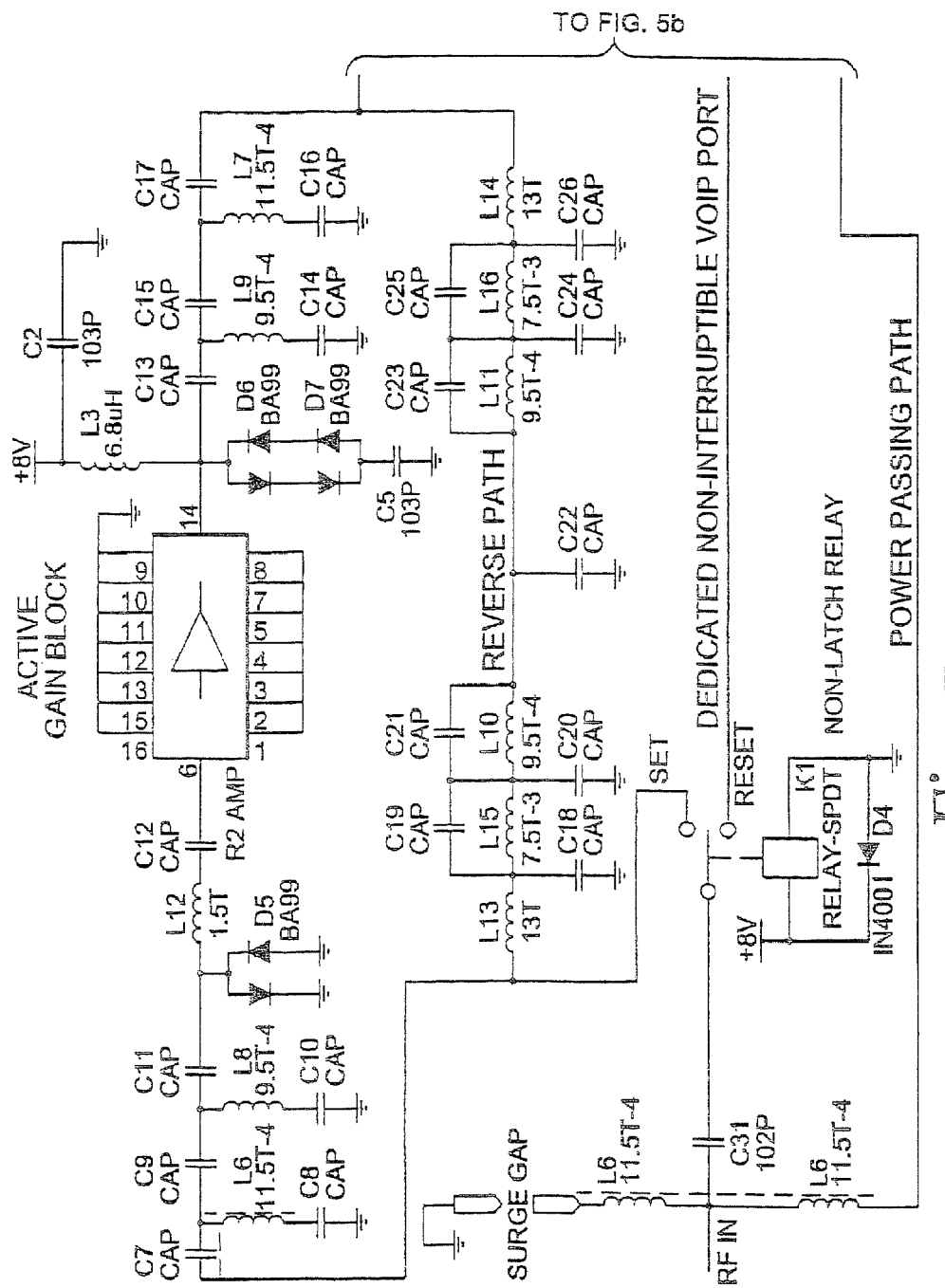
FIGS. 5a and 5b are a circuit schematic diagram of a bi-directional RF signal amplifier employing a non-latching relay and a directional coupler for facilitating a non-interruptible communication port, in accordance with embodiments of the present invention.
Figure 5B:
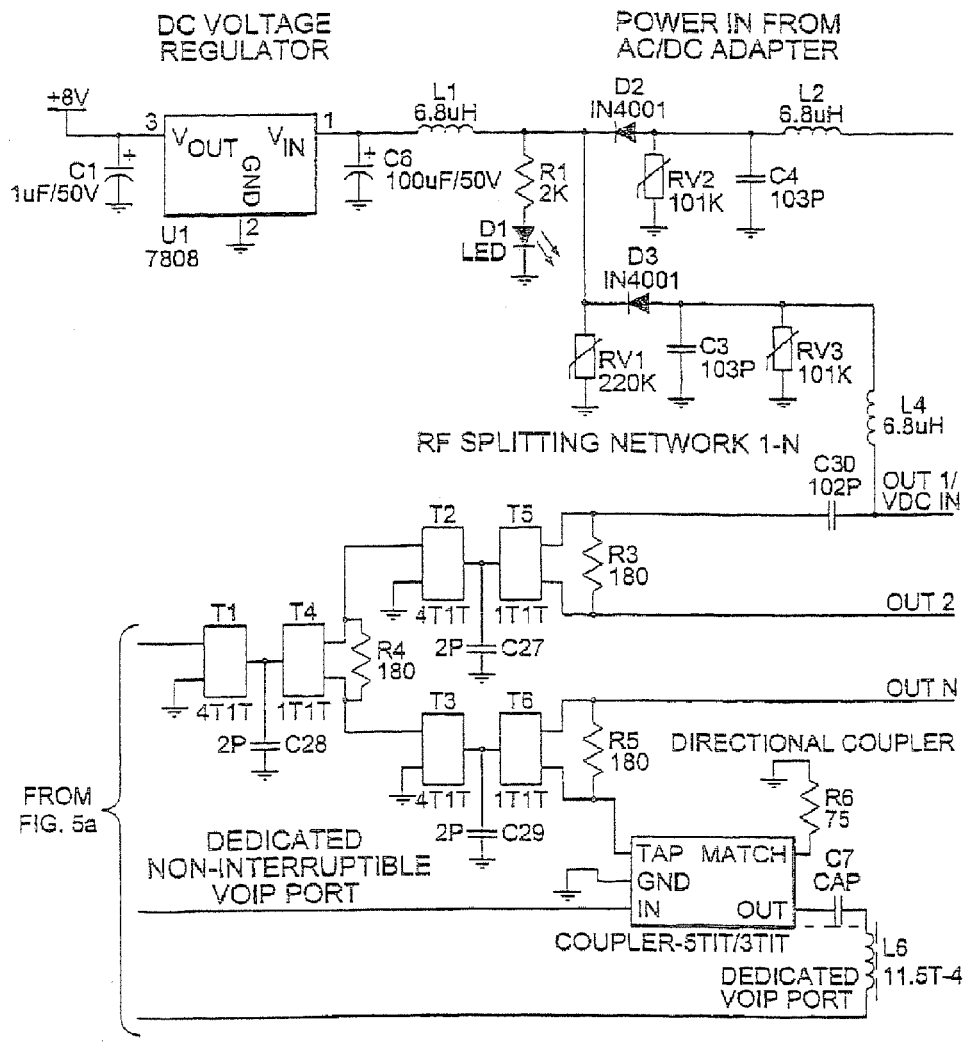

It will be appreciated that the use of the second communication path between ports 210 and 260 can provide a significant advantage in ensuring the availability of communication to at least one communication device in the event of power failure. A communication device in communication with port 260 (such as a VoIP compatible device, or other device) can further be provided with backup battery power to maintain the operation of the communication device. As discussed above, a schematic representation of the amplifier 200 of FIG. 2 is set forth in FIGS. 5a and 5b.

FIG. 3a illustrates a block diagram of a bi-directional RF signal amplifier 300 employing a plurality of non-latching relays for facilitating a non-interruptible communication port 360. As illustrated, amplifier 300 can support a plurality of bi-directional communication ports for sending and receiving RF signals to and from a variety of signal sources and destinations.

Similar to amplifiers 100 and 200 previously discussed herein, amplifier 300 includes a bi-directional RF input port 310 for receiving RF signals from a service provider, or any other appropriate signal source. Input port 310 can also pass output signals in the reverse direction from the amplifier 300 through the port 310 to the service provider or other signal source.

A plurality of bi-directional output ports 360, 362, and 366 can also be provided by amplifier 300 for passing RF signals from the amplifier 300 to one or more devices in communication with the output ports, and vice versa. Similar to amplifiers 100 and 200, it will be appreciated that any appropriate device that may advantageously send and/or receive an RF signal may be placed in communication with one or more of the various output ports of amplifier 300. For example, it is contemplated that telephone, CATV, Internet, VoIP, and/or data communication devices may be placed in such communication where the amplifier 300 is installed in the residence of a subscriber to a service provider. However, it will further be appreciated that any desired combination of these and/or other devices may be used where appropriate.

Signals received through input port 310 can be passed through a first communication path between input port 310 to output ports 360, 362, and/or 366. Specifically, the signals can be fed through a non-latching relay 320 to a high/low diplexer 330 for separating the high frequency input signal from any low frequency output signal incident in the reverse direction. In various embodiments, diplexer 330 can filter the signals in a manner such that signals with frequencies greater than approximately 45-50 MHz are passed as high frequency input signals received from port 310, while signals with frequencies lower than such range are passed in the reverse direction as low frequency output signals received from ports 360, 362, or 366.

The high frequency input signals filtered by diplexer 330 can be amplified by individual amplifier 340, and passed to high/low diplexer 335 where they are combined with the output signals. The recombined signal can then be provided to power dividers 350, where it is distributed to any of ports 360, 362, and/or 366. As illustrated, signals provided to port 360 through a SPDT non-latching relay 325 can further be passed through an attenuator pad 390 for reducing the strength of the amplified signal (approximately 20 dBmV/channel) by approximately 5 dBmV/channel.

Turning now to the reverse signal flow through the first communication path of amplifier 300, signals received by the amplifier 300 from devices in communication with ports 362 and/or 366 can be passed to power dividers 350 where they are combined into a composite output signal. Signals received through port 360 can be passed to power dividers 350 through non-latching relay 325 and attenuator pad 390, and also combined into the composite signal. The output signal can be fed through high/low diplexer 335 for separating the low frequency output signal from any high frequency input signal incident in the forward direction. As previously discussed in relation to diplexer 330, the diplexer 335 can filter the signals such that signals with frequencies greater than approximately 45-50 MHz are passed in the forward direction as high frequency signals received from port 310, while signals with frequencies lower than such range are passed in the reverse direction as low frequency signals received from ports 360, 362, and/or 366.

The low frequency output signals filtered by diplexer 335 can be amplified by individual amplifier 345, and passed to high/low diplexer 330 where they are combined with the input signals. In various embodiments, individual amplifier 345 can optionally be omitted from amplifier 300. The recombined signal can then be provided to SPDT non-latching relay 320 where it is passed to port 310 for output to a service provider or other entity in communication with port 310.

As illustrated, amplifier 300 can further provide a power passing path 380, allowing power to be transmitted between ports 310 and 360.

During normal operation, the amplifier 300 can be powered from a power input port 370 and/or power that is reverse fed through RF OUT N/VDC IN port 366. In a typical installation at a subscriber's residence, it is contemplated that amplifier 300 may be powered by an AC/DC adapter receiving power provided by the residence (for example, 100-230 VAC, 50/60 Hz). As illustrated in FIG. 3, the power received from either power input can be provided to a voltage regulator 375 which supplies an operating voltage VCC to individual amplifiers 340 and/or 345.

In the event that power to voltage regulator 375 is interrupted, voltage regulator 375 will be unable to provide operating voltage VCC to individual amplifiers 340 and/or 345. As a result, individual amplifier 340 will not function to amplify the input signals received through port 310 for proper distribution to the various output ports 360, 362, and/or 366. Similarly, individual amplifier 345 also will not function to amplify the output signals received from ports 360, 362, and/or 366.

As a result, amplifier 300 further provides a second communication path between input port 310 and output port 360. In this regard, a dedicated non-interruptible port 360 can communicate with port 310 through relay 320 and relay 325. As illustrated, amplifier 300 provides a VCC path 323 to relay 320, and a second VCC path 327 to relay 325. When power (i.e. VCC) is interrupted, the relays 320 and 325 will be caused to switch from the normal signal path in the "set" positions, to the non-interruptible signal path in the "reset" positions or vice versa. As a result, using the non-interruptible signal path between ports 310 and 360 through relays 320 and 325, signals can still be passed between a device in communication with port 360 and a service provider in communication with port 310. It will be appreciated that although the second communication path of amplifier 300 does not necessarily amplify the input or output signals, the path can nevertheless permit communication of at least one or more services, such as emergency 911 telephone service.

Figure 6A:
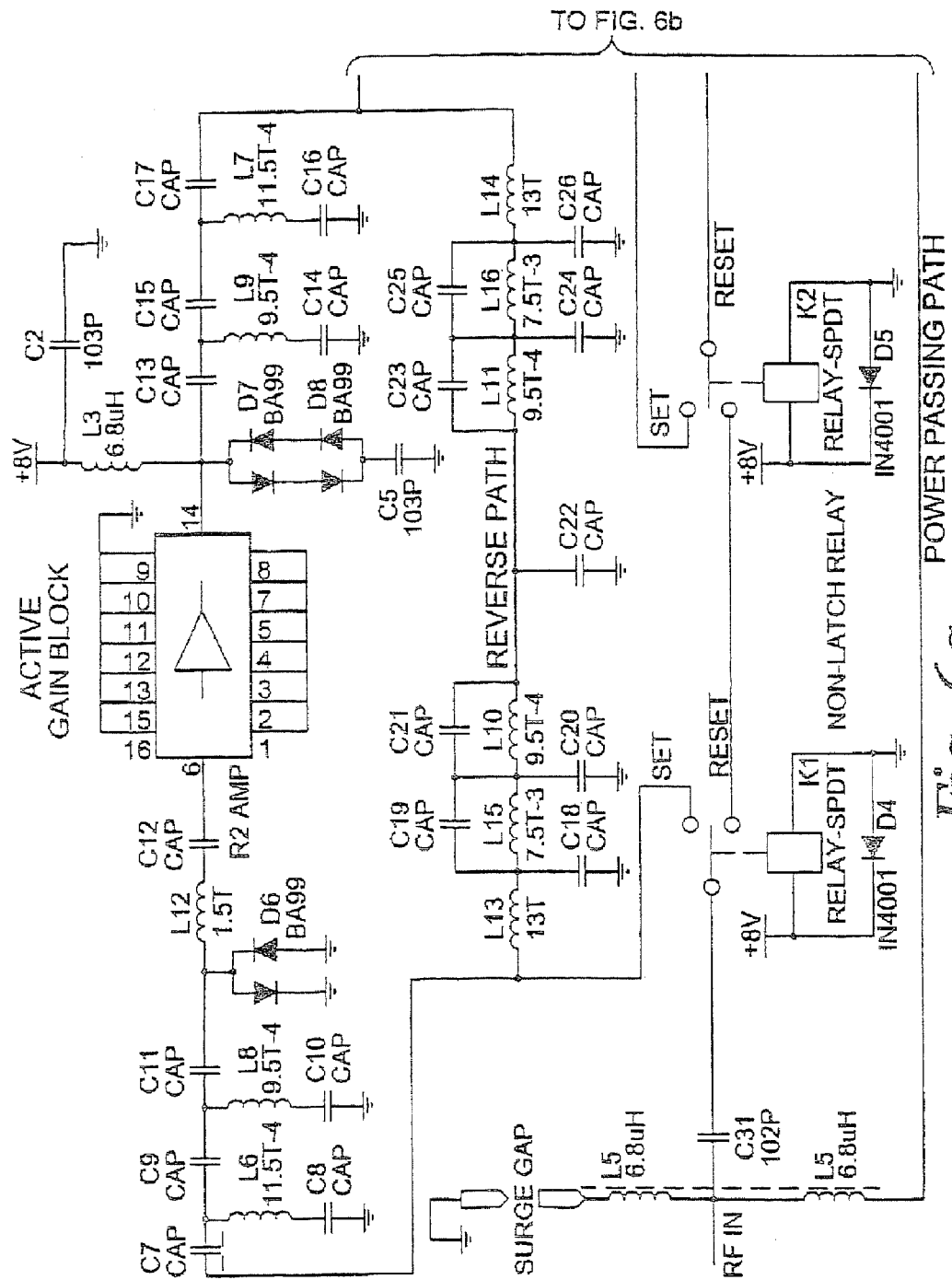
FIGS. 6a and 6b are a circuit schematic diagram of a bi-directional RF signal amplifier employing a plurality of non-latching relays for facilitating a non-interruptible communication port, in accordance with embodiments of the present invention.
Figure 6B:
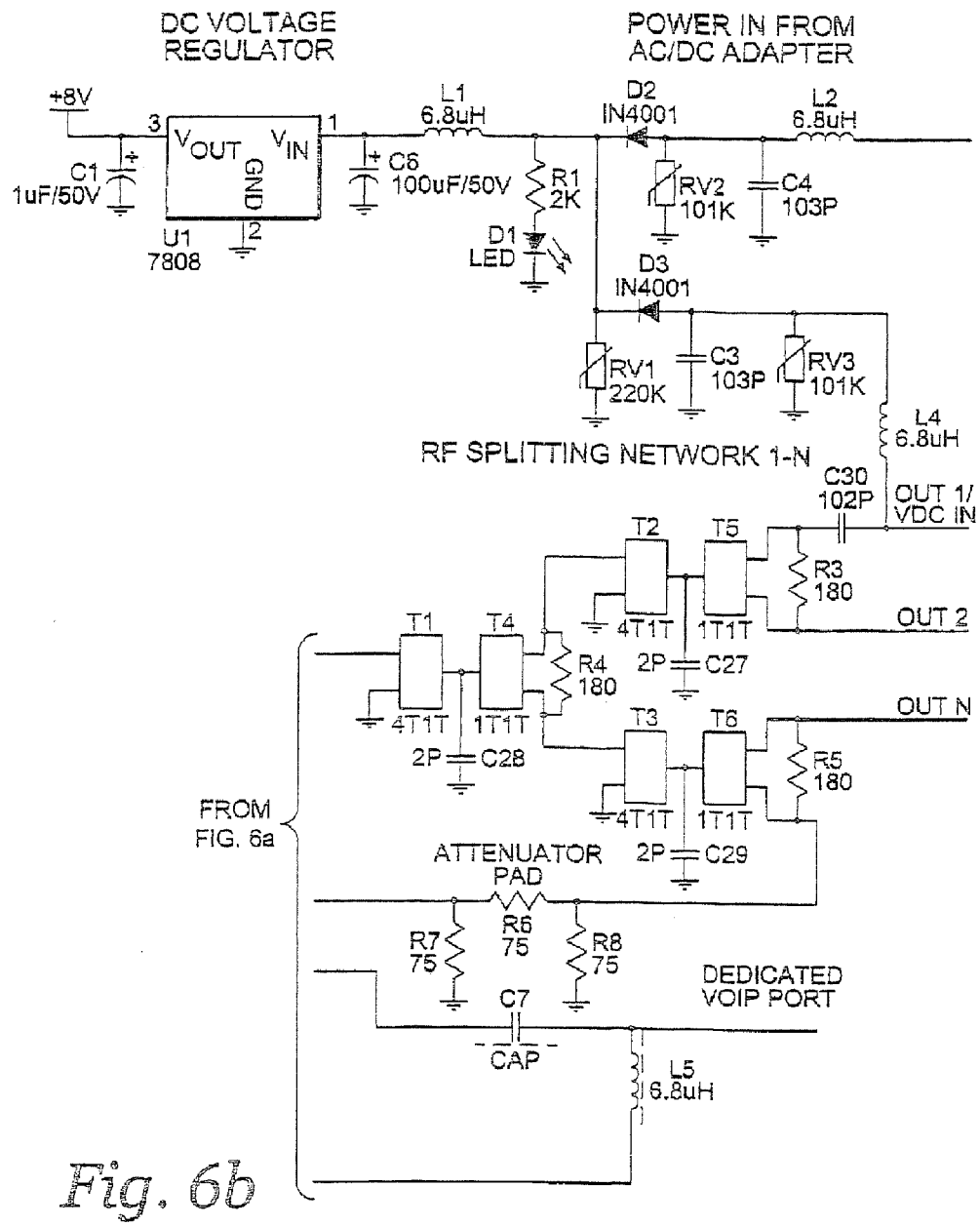

It will be appreciated that the use of the second communication path between ports 310 and 360 can provide a significant advantage in ensuring the availability of communication to at least one communication device in the event of power failure. A communication device in communication with port 360 (such as a VoIP compatible device, or other device) can further be provided with backup battery power to maintain the operation of the communication device. As discussed above, a schematic representation of the amplifier 300 of FIG. 3a is set forth in FIGS. 6a and 6b.

Figure 3B:
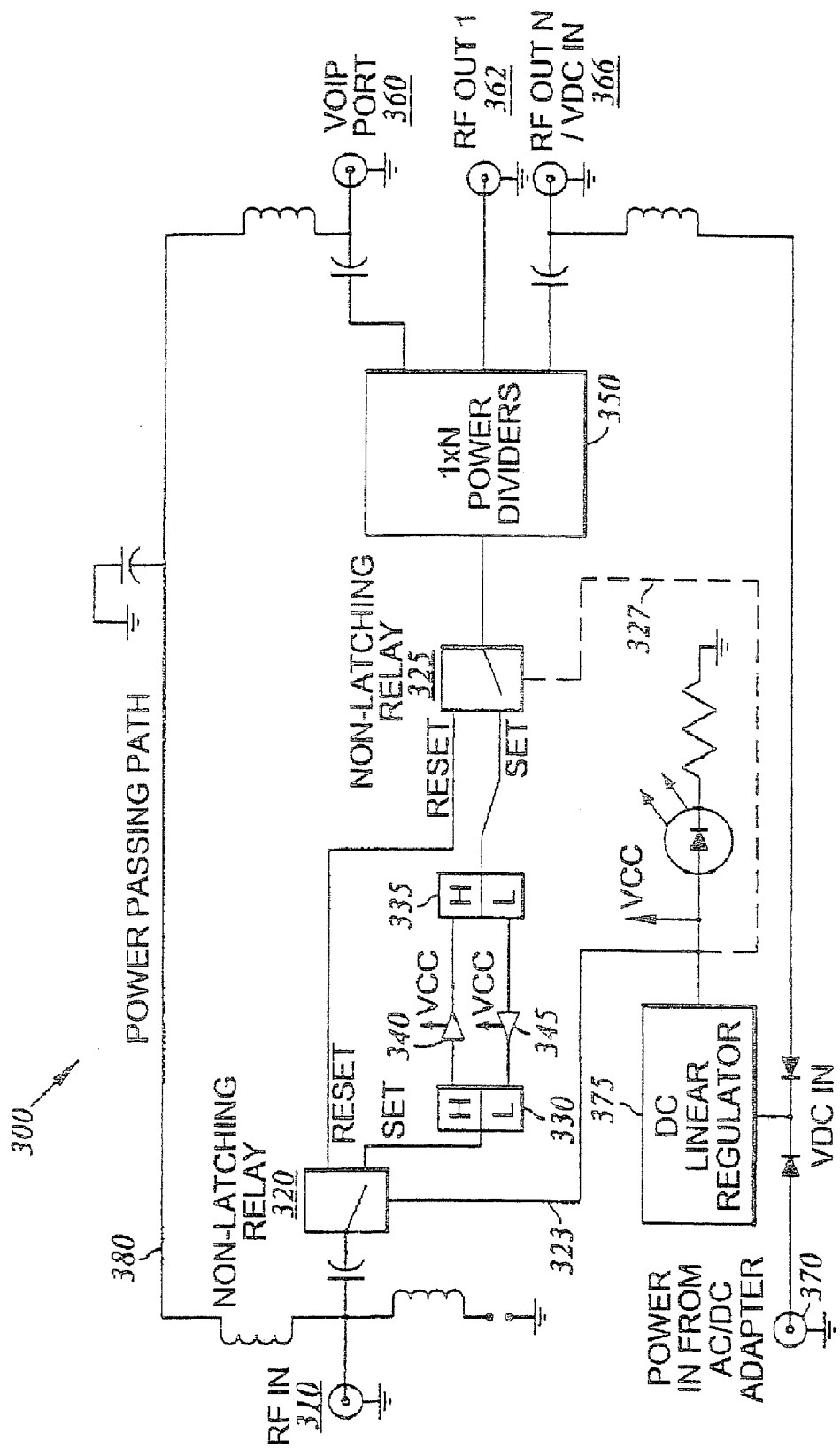

FIG. 3b illustrates a block diagram of an alternate embodiment of bi-directional RF signal amplifier 300. As illustrated, the embodiment of FIG. 3b revises the connections of relay 325, diplexers 335, and power dividers 350. It will be appreciated that the embodiment of FIG. 3b allows each of the output ports 360, 362, and 366 to be switched. It will further be appreciated that a schematic representation of the embodiment of FIG. 3b can be provided through appropriate manipulation of the schematic of FIGS. 6a and 6b.

Figure 7:
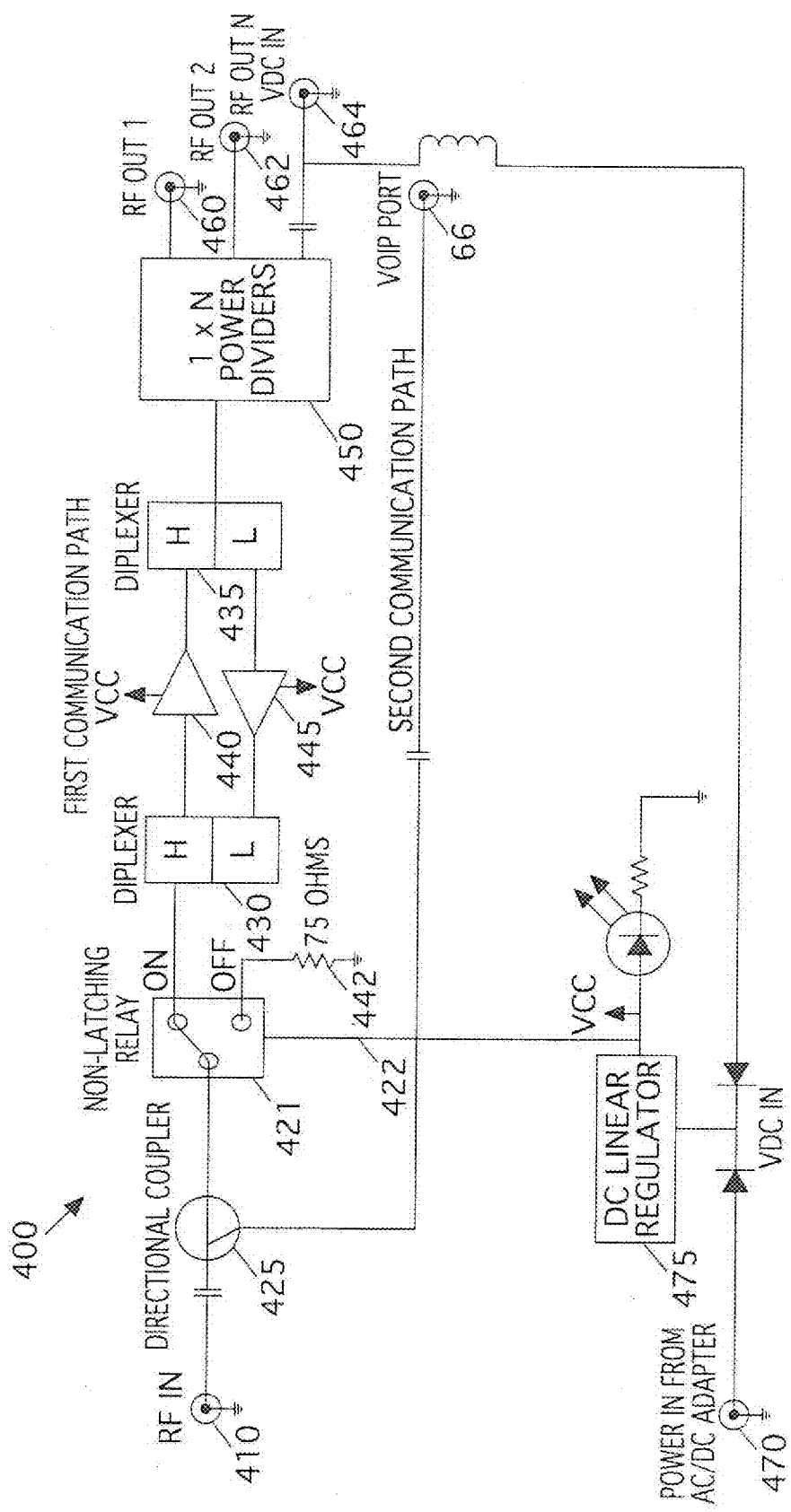
FIG. 7 is a block diagram of a bi-directional RF signal amplifier employing a terminated non-latching relay and a directional coupler for facilitating a non-interruptible communication port, in accordance with embodiments of the present invention.

FIG. 7 is a block diagram of a bi-directional RF signal amplifier 400 employing a non-latching relay 421 and a directional coupler 425 for maintaining a non-interruptible communication port 466. As illustrated, amplifier 400 can support a plurality of bi-directional communication ports for sending and receiving RF signals to and from a variety of signal sources and destinations.

Similar to amplifier 100 previously discussed herein, amplifier 400 includes a bi-directional RF input port 410 for receiving RF signals from a service provider, or any other appropriate signal source. RF input port 410 can also pass output signals in the reverse direction from the amplifier 400 through the port 410 to the service provider or other signal source.

A plurality of bi-directional output ports 460, 462, 464 and 466 can also be provided by amplifier 400 for passing RF signals from the amplifier 400 to one or more devices in communication with the output ports, and vice versa. Similar to amplifier 100, it will be appreciated that any appropriate device that may advantageously send and/or receive an RF signal may be placed in communication with one or more of the various output ports 460, 462, 464 and/or 466 of amplifier 400. For example, it is contemplated that telephone, CATV, Internet, VoIP, and/or data communication devices may be placed in such communication where the amplifier 400 is installed in the residence of a subscriber to a service provider. However, it will further be appreciated that any desired combination of these and/or other devices may be used where appropriate.

Signals received through input port 410 can be passed through a passive directional coupler 425 to first and second communications paths. It will be appreciated that the directional coupler 425 may either evenly or unevenly split the power of the input signals between the first and second communications path, depending on the design of the overall circuit. As shown in FIG. 7, the first communication path includes an SPDT non-latching relay 421, a high/low diplexer 430, a power amplifier 440, a power amplifier 445, a high/low diplexer 435 and 1×N power dividers 450, which components connect the first output of the directional coupler 425 to the output ports 460, 462 and 464. In particular, the signals output by directional coupler 425 to the first communications path are first input to an SPDT non-latching relay 421. When the non-latching relay 421 is in the "ON" or "SET" state, these signals then pass to a high/low diplexer 430 for separating the high frequency input signal from any low frequency output signal incident in the reverse direction. In various embodiments, diplexer 430 can filter the signals in a manner such that signals with frequencies greater than approximately 45-50 MHz are passed as high frequency input signals received from port 410, while signals with frequencies lower than such range are passed in the reverse direction as low frequency output signals received from ports 460, 462, and/or 464.

The high frequency input signals filtered by diplexer 430 can be amplified by individual amplifier 440, and passed to high/low diplexer 435. The output of diplexer 435 is then provided to 1×N power dividers 450, where it is distributed to any of ports 460, 462, and/or 464.

Turning now to the reverse signal flow through the first communication path of amplifier 400, signals received by the amplifier 400 from devices in communication with ports 460, 462 and/or 464 can be passed to power dividers 450 where they are combined into a composite output signal. This composite output signal can be fed through high/low diplexer 435 for separating the low frequency output signal from any high frequency input signal incident in the forward direction. As previously discussed in relation to diplexer 430, the diplexer 435 can filter the signals such that signals with frequencies greater than approximately 45-50 MHz are passed in the forward direction as high frequency signals received from port 410, while signals with frequencies lower than such range are passed in the reverse direction as low frequency signals received from ports 460, 462, and/or 464.

The low frequency output signals filtered by diplexer 435 can be amplified by individual amplifier 445, and passed to high/low diplexer 430 where they are combined with the input signals. In various embodiments, individual amplifier 445 can optionally be omitted from amplifier 400. The recombined signal can then be provided to non-latching relay 421 where it is passed to the RF input port 410 via the directional coupler 425 for output to a service provider or other entity in communication with the RF input port 410. The amplifiers 440 and 445 may have different gains. For example, in some embodiments, amplifier 440 may have about 18 dB gain, while amplifier 445 may have about 15 dB gain. An attenuator (not shown in FIG. 7) may also be provided, for example, between amplifier 445 and diplexer 435.

During normal operation, the amplifier 400 can be powered from a power input port 470 and/or power that is reverse fed through RF OUT N/VDC IN port 464. In a typical installation at a subscriber's residence, it is contemplated that amplifier 400 may be powered by an AC/DC adapter receiving power provided by the residence (for example, 100-230 VAC, 50/60 Hz). As illustrated in FIG. 7, the power received from either power input can be provided to a voltage regulator 475 which supplies an operating voltage VCC to individual amplifiers 440 and/or 445.

In the event that power to voltage regulator 475 is interrupted, voltage regulator 475 will be unable to provide operating voltage VCC to individual amplifiers 440 and/or 445. As a result, individual amplifier 440 will not function to amplify the input signals received through port 410 for proper distribution to the various output ports 460, 462, and/or 464. Similarly, individual amplifier 445 also will not function to amplify the output signals received from ports 460, 462, and/or 464.

Accordingly, amplifier 400 further provides a second, non-interruptible communication path between input port 410 and Voice Over IP (VOIP) output port 466. In particular, as shown in FIG. 7, the signals output by directional coupler 425 to the second communications path may be passed directly to the VOIP output port 466.

Thus, in the embodiment of FIG. 7, the directional coupler 425 is used to split a signal received through input port 410 into two separate components, and delivers the first component of the split signal to RF output ports 460, 462 and 464 via a first communication path and delivers the second component of the split signal to VOIP port 466 via a second communication path. Consequently, even if power is interrupted such that the amplifiers 440 and 445 are rendered inoperable, a second, non-interruptible communication path still exists between RF input port 410 and VOIP port 466 which can be used to support communication of at least one or more services, such as emergency 911 telephone service.

As is also illustrated in FIG. 7, amplifier 400 provides a VCC path 422 to relay 421. When power (i.e., VCC) is interrupted, the relay 421 will be caused to switch from the normal signal path in the "ON" (or "SET") position, to the "OFF" (or "RESET") position (or vice versa when power is resumed).

The second output port of relay 421 (the "OFF" port) is connected to a matched resistive termination (here a 75 ohm resistor 442). When the power supply is interrupted, the relay 421 senses the interruption and switches from the "ON" position to the "OFF" position. As the OFF position of relay 421 is coupled to the matched resistive termination, both outputs of the directional coupler 425 are matched. As such, signal degradation due to reflections and the like can be reduced or minimized in order to provide acceptable signal quality on the second, non-interruptible communications path.

It will be appreciated that providing a second, non-interruptible communication path between ports 410 and 466 can provide a significant advantage in ensuring the availability of communication to at least one communication device in the event of power failure. A communication device in communication with port 466 (such as a VoIP compatible device, or other device) can further be provided with backup battery power to maintain the operation of the communication device.

As should be clear from the above description, the amplifier 400 of FIG. 7 includes a selective termination circuit that is configured to pass signals between the RF input port and the first RF output port over the first communication path when electrical power is received at the power input and that is further configured to terminate the first communication path to a matched termination when an electrical power feed to the power input is interrupted. In the particular embodiment of FIG. 7, this selective termination circuit comprises a relay that completes the first communication path when electrical power is received at the power input, but terminates the first communication path to a matched termination when an electrical power feed to the power input is interrupted.

Herein, the term "matched termination" is used to refer to a termination that approximately matches the specific transmission paths impedance (in this case 75 ohms), thus being capable of substantially absorbing the possible propagation modes with minimal reflection. The term "resistive termination" is used to refer to a termination that includes at least one purposefully resistive element such as a resistor. By providing such a matched resistive termination in signal amplifier 400, the directional coupler may be configured to have two impedance matched output terminals even when the integrated circuit chip containing the power amplifiers 440 and 445 shuts down for lack of power, and hence reflections that result in return loss, frequency response and/or other signal degradation can be reduced in these circumstances. This may significantly improve the signal quality on the second, non-interruptible communication path (in both the forward and reverse directions) when the first communication path is inactive (i.e., terminated to the matched resistive termination).

Figure 8:
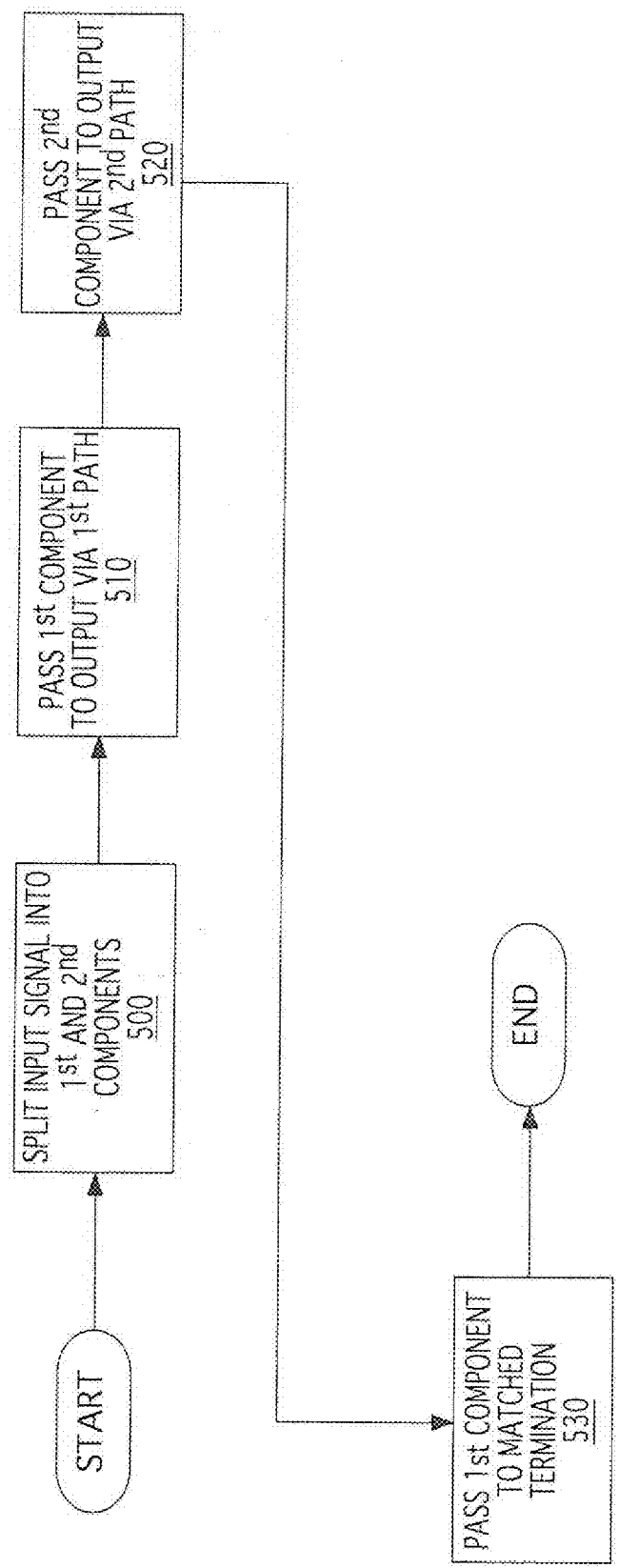
FIG. 8 is a flow chart diagram illustrating methods of providing a non-interruptible communication path through a signal amplifier according to embodiments of the present invention.

FIG. 8 is a flow chart illustrating methods of providing a non-interruptible communication path through a signal amplifier that includes an RF input port and multiple RF output ports according to embodiments of the present invention. As shown in FIG. 8, pursuant to these methods, a directional coupler may be used to split a signal received at the RF input port into a first signal component and a second signal component (block 500). The signal may comprise, for example, a composite signal from a service provider that includes CATV signals, broadband Internet traffic and/or Internet telephone service traffic. The directional coupler may comprise a splitter that evenly divides the signal energy of the input signal when it splits the signal into the first and second components, or may comprise a weighted directional coupler that provides more of the signal energy to one of the components (e.g., the first component) than to the second component. As is further shown in FIG. 8, the first component is coupled to one or more output ports of the signal amplifier via a first communication path, such as, for example, the first communication path illustrated in FIG. 7 (block 510). Likewise, the second component is coupled to a different output port of the signal amplifier via a second communication path, such as, for example, the second communication path illustrated in FIG. 7 (block 520). At some point, the power feed to the signal amplifier is interrupted. In response to this interruption, the first component of the input signal is routed to a matched resistive termination (block 530).

Figure 9A:
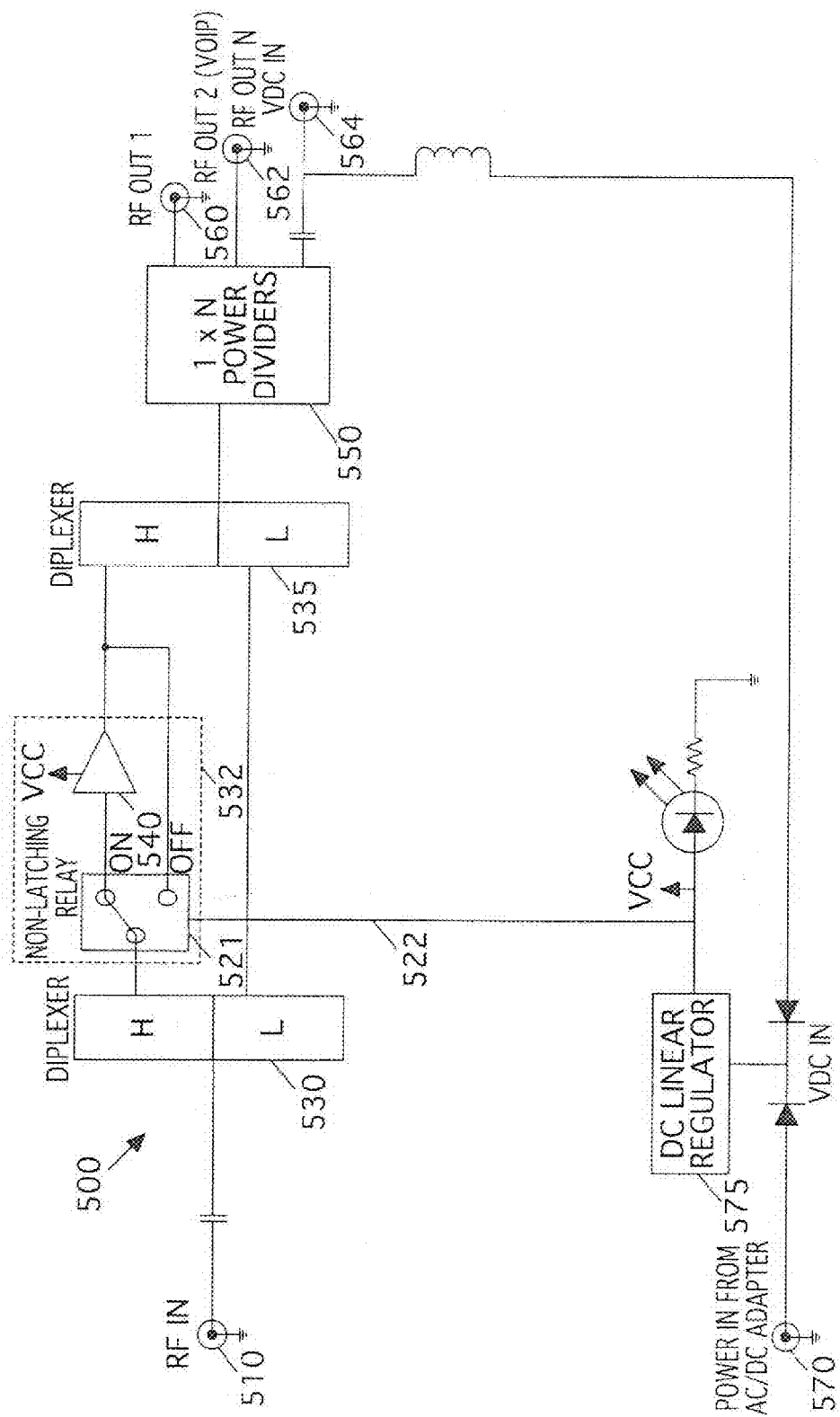
FIG. 9A is a block diagram of a bi-directional RF signal amplifier employing an integrated non-latching relay and amplifier in the forward path for facilitating a non-interruptible communication port, in accordance with embodiments of the present invention.

FIG. 9A is a block diagram of a bi-directional RF signal amplifier 500 employing an integrated circuit chip 532 in the forward path that includes a non-latching relay 521 and an amplifier 540 for facilitating a non-interruptible communication port 564. As illustrated, amplifier 500 can support a plurality of bi-directional communication ports for sending and receiving RF signals to and from a variety of signal sources and destinations.

Amplifier 500 includes a bi-directional RF input port 510 for receiving RF signals from a service provider, or any other appropriate signal source. RF input port 510 can also pass output signals in the reverse direction from the amplifier 500 through the port 510 to the service provider or other signal source.

A plurality of bi-directional output ports 560, 562 and 564 can also be provided by amplifier 500 for passing RF signals from the amplifier 500 to one or more devices in communication with the output ports, and vice versa. It will be appreciated that any appropriate device that may advantageously send and/or receive an RF signal may be placed in communication with one or more of the various output ports 560, 562 and/or 564 of amplifier 500. For example, it is contemplated that telephone, CATV, Internet, VoIP, and/or data communication devices may be placed in such communication where the amplifier 500 is installed in the residence of a subscriber to a service provider. However, it will further be appreciated that any desired combination of these and/or other devices may be used where appropriate.

Signals received through input port 510 can be passed directly to a high/low diplexer 530 that separates the high frequency input signal from any low frequency output signal incident in the reverse direction. In various embodiments, diplexer 530 can filter the signals in a manner such that signals with frequencies greater than approximately 45-50 MHz are passed as high frequency input signals received from port 510, while signals with frequencies lower than such range are passed in the reverse direction as low frequency output signals received from ports 560, 562, and/or 564. The high frequency input signals filtered by diplexer 530 are passed to an SPDT non-latching relay 521. When the non-latching relay 521 is in the "ON" or "SET" state, these signals then pass to a power amplifier 540, then to a high/low diplexer 535 and 1×N power dividers 550 where the signals are passed to the output ports 560, 562 and 564.

Turning now to the reverse signal flow through amplifier 500, signals received by the amplifier 500 from devices in communication with ports 560, 562 and/or 564 can be passed to power dividers 550 where they are combined into a composite output signal. This composite output signal can be fed through high/low diplexer 535 for separating the low frequency output signal from any high frequency input signal incident in the forward direction. As previously discussed in relation to diplexer 530, the diplexer 535 can filter the signals such that signals with frequencies greater than approximately 45-50 MHz are passed in the forward direction as high frequency signals received from port 410, while signals with frequencies lower than such range are passed in the reverse direction as low frequency signals received from ports 560, 562, and/or 564.

The low frequency output signals filtered by diplexer 535 are passed without amplification to high/low diplexer 530 where they are combined with the input signals. The recombined signal can then be passed to the RF input port 510 for output to a service provider or other entity in communication with the RF input port 510.

During normal operation, the amplifier 500 can be powered from a power input port 570 and/or power that is reverse fed through RF OUT N/VDC IN port 564. In a typical installation at a subscriber's residence, it is contemplated that amplifier 500 may be powered by an AC/DC adapter receiving power provided by the residence (for example, 100-230 VAC, 50/60 Hz). As illustrated in FIG. 9A, the power received from either power input can be provided to a voltage regulator 575 which supplies an operating voltage VCC to individual amplifier 540.

In the event that power to voltage regulator 575 is interrupted, voltage regulator 575 will be unable to provide operating voltage VCC to individual amplifier 540. As a result, individual amplifier 540 will not function to amplify the input signals received through port 510 for proper distribution to the various output ports 560, 562, and/or 564.

Accordingly, amplifier 500 further provides a second, non-interruptible communication path between input port 510 and the output ports 560, 562 and, in particular, Voice Over IP (VOIP) output port 564. More particularly, when power (i.e., VCC) is interrupted, the relay 521 will be caused to switch from the normal signal path in the "ON" (or "SET") position, to the "OFF" (or "RESET") position (or vice versa when power is resumed). The second output port of relay 521 (the "OFF" port) is connected so as to bypass the amplifier 540, thus providing a second, non-interruptible communications path between diplexer 530 and diplexer 535. When the power supply is interrupted, the relay 521 senses the interruption and switches from the "ON" position to the "OFF" position, thereby activating the non-interruptible (and non-amplified) communications path. Consequently, even if power is interrupted such that the amplifier 540 is rendered inoperable, a second, non-interruptible communication path still exists between RF input port 510 and VOIP port 564 which can be used to support communication of at least one or more services, such as emergency 911 telephone service. Note that in the embodiment of FIG. 9A, any of the output ports may be the VOIP port (i.e., it does not have to be output port 564).

It will be appreciated that providing a second, non-interruptible communication path between ports 510 and 564 can provide a significant advantage in ensuring the availability of communication to at least one communication device in the event of power failure. A communication device in communication with port 564 (such as a VoIP compatible device, or other device) can further be provided with backup battery power to maintain the operation of the communication device.

In some embodiments, the non-latching relay 521 and the amplifier 540 may be implemented on a single integrated circuit chip 532. It will also be appreciated that in some embodiments, the integrated circuit chip 532 may include one or more additional relays. By way of example, the integrated circuit chip 532 may include a second relay that together with relay 521 physically disconnect the amplifier 540 from the electrical path. this configuration may further improve the impedance match of the bypass trace (i.e., the trace from the second output of relay 521 to the diplexer 535).

Figure 9B:
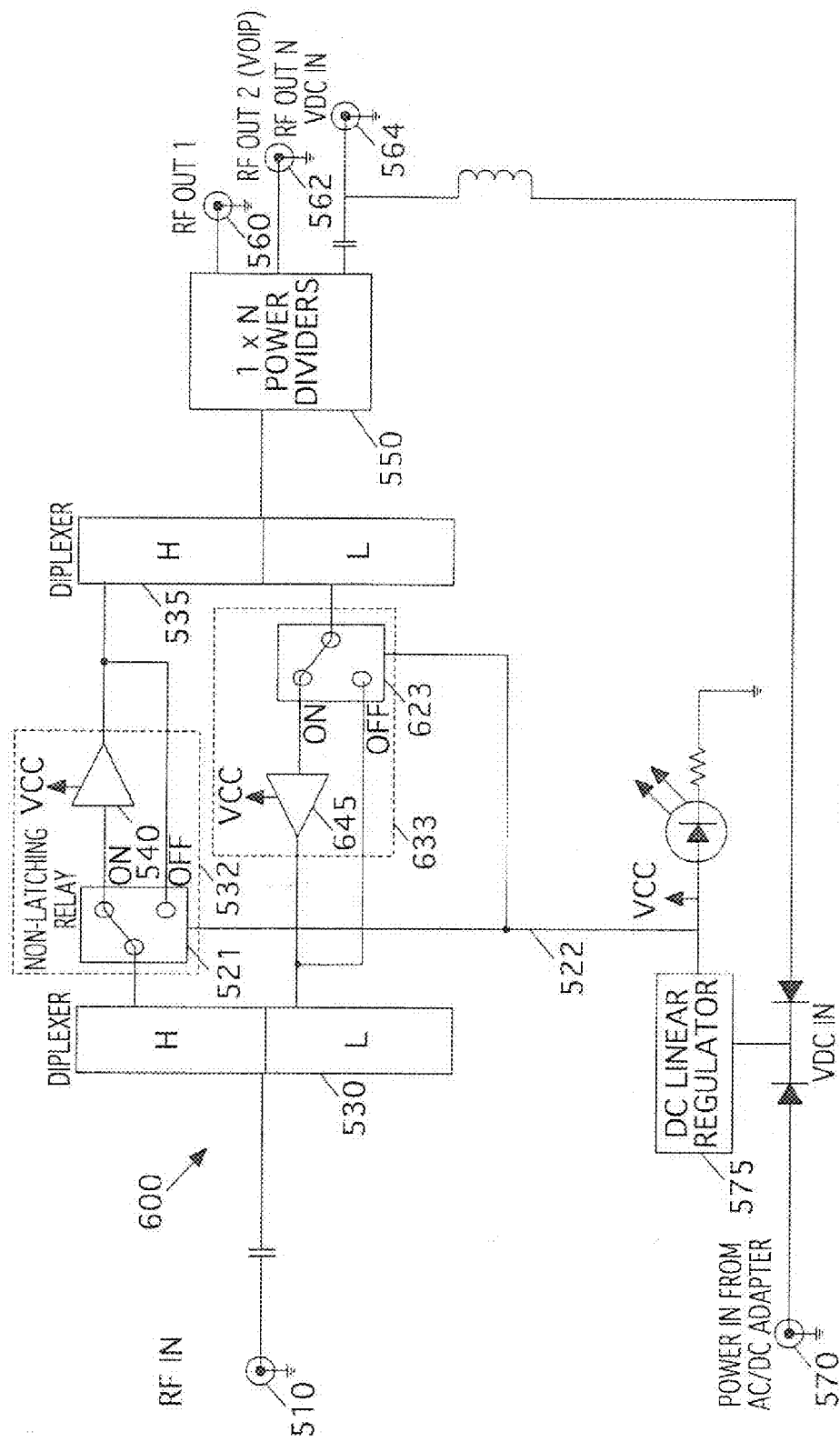
FIG. 9B is a block diagram of a bi-directional RF signal amplifier employing an integrated non-latching relay and amplifier in both the forward and reverse paths for facilitating a non-interruptible communication port, in accordance with embodiments of the present invention.

FIG. 9B is a block diagram of a bi-directional RF signal amplifier 600 that includes a first integrated circuit chip 532 in the forward path that includes a non-latching relay 521 and an amplifier 540, and a second integrated circuit chip 633 in the reverse path that includes a non-latching relay 623 and an amplifier 645 for facilitating a non-interruptible communication port 564. The RF signal amplifier 600 may be nearly identical to the RF signal amplifier 500 of FIG. 9A, except that the RF signal amplifier 600 employs a second integrated circuit chip 633 in the reverse path that includes a non-latching relay 623 and an amplifier 645. Consequently, circuit elements of RF signal amplifier 600 that are identical to the corresponding circuit elements of RF signal amplifier 500 of FIG. 9A are given like reference numerals, and these circuit elements and the operation thereof will not be described further herein.

As noted above, the difference between RF signal amplifier 600 of FIG. 9B and the RF signal amplifier 500 of FIG. 9A is the inclusion of a second integrated circuit chip 633 in the reverse path. This second integrated circuit chip 633 has a non-latching relay 623 and an amplifier 645. During normal operation, the amplifier 645 is powered by VCC and the non-latching relay 623 is in the "ON" or "SET" state so that signals in the reverse path are passed through power amplifier 645. However, if power to voltage regulator 575 is interrupted, the relay 623 senses the interruption and switches from the "ON" position to the "OFF" position. The second output port of relay 623 (the "OFF" port) is connected so as to bypass the amplifier 645, thus providing a second, non-interruptible communications path in the reverse direction between diplexer 535 and diplexer 530. Thus, the RF signal amplifier 600 provides amplification in the reverse direction during normal operation, while still providing non-interruptible (and non-amplified) communications paths in both the forward and reverse directions when power is interrupted.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure. For example, any number of RF output ports may be supported by the various amplifier embodiments discussed herein.

That which is claimed is:

1. A bi-directional RF signal amplifier, comprising
an RF input port;
a first RF output port;
a second RF output port;
a power input for receiving electrical power;
a first communication path between the RF input port and the first RF output port, the first communication path including a power amplifier that is configured to amplify signals that are transmitted from the RF input port to the first RF output port via the first communication path;
a second non-interruptible communication path between the RF input port and the second RF output port;
a selective termination circuit that is configured to pass signals between the RF input port and the first RF output port over the first communication path when electrical power is received at the power input and that is further configured to terminate the first communication path to a matched termination when an electrical power feed to the power input is interrupted.

2. The bi-directional RF signal amplifier of claim 1, wherein the selective termination circuit comprises a relay having an input terminal, a first output terminal and a second output terminal, wherein the first output terminal of the relay is coupled to the power amplifier and the second output terminal of the relay is connected to the matched termination.

3. The bi-directional RF signal amplifier of claim 2, further comprising a directional coupler having an input that is connected to the RF input port, a first output that is connected to the input terminal of the relay and a second output that is connected to the second non-interruptible communication path.

4. The bi-directional RF signal amplifier of claim 3, wherein the matched termination comprises a resistor that is terminated to a ground voltage.

5. The bi-directional RF signal amplifier of claim 3, further comprising a power regulation circuit that receives electrical power from the power input and that outputs a power supply voltage, wherein the power supply voltage is coupled to the power amplifier and to the relay.

6. The bi-directional RF signal amplifier of claim 5, wherein the directional coupler splits an input signal evenly between its first output and its second output.

7. The bi-directional RF signal amplifier of claim 5, wherein the directional coupler splits an input signal unevenly so as to pass more signal energy to its first output than is passed to its second output.

8. The bi-directional RF signal amplifier of claim 1, wherein the power amplifier comprises a first power amplifier, and wherein the first communication path includes a forward path from the RF input port to the first RF output port and a reverse path from the first RF output port to the RF input port, and wherein the reverse path includes a second power amplifier.

9. The bi-directional RF signal amplifier of claim 8, wherein the second amplifier has a gain that is different than a gain of the first power amplifier.

10. The bi-directional RF signal amplifier of claim 8, wherein the first communication path further comprises a first diplexer that is between the first output terminal of the relay and the first power amplifier and a second diplexer that is between the first power amplifier and the first RF output port.

11. The bi-directional RF signal amplifier of claim 10, further comprising a power dividing circuit having an input and a plurality of outputs that is between the second diplexer and the first RF output port, wherein the first RF output port is connected to one of the plurality of outputs of the power dividing circuit.

12. The bi-directional RF signal amplifier of claim 1, wherein the second RF output port comprises a voice-over-IP RF output port.

13. The bi-directional RF signal amplifier of claim 1, wherein the power input for receiving electrical power comprises the first RF output port.

14. An RF signal amplifier, comprising
an RF input port;
a first RF output port;
a second RF output port;
a relay having an input terminal, a first output terminal and a second output terminal;
a directional coupler having an input that is connected to the RF input port, a first output that is connected to the input terminal of the relay and a second output that is connected to the second RF output port;
a power amplifier that is provided between the first output terminal of the relay and the first RF output port;
a termination that includes a resistive element that is coupled to the second output terminal of the relay;
a first diplexer that is between the first output terminal of the relay and the power amplifier; and a second diplexer that is between the power amplifier and the first RF output port.

15. The RF signal amplifier of claim 14, wherein the power amplifier comprises a first power amplifier, and wherein the RF signal amplifier further comprises a second power amplifier that is between the first diplexer and the second diplexer, wherein the first power amplifier is configured to amplify signals that are carried from the first diplexer to the second diplexer and wherein the second power amplifier is configured to amplify signals that are carried from the second diplexer to the first diplexer.

16. The RF signal amplifier of claim 15, further comprising a power dividing circuit having an input and a plurality of outputs that is between the second diplexer and the first RF output port, wherein the first RF output port is connected to one of the plurality of outputs of the power dividing circuit.

17. An RF signal amplifier, comprising
an RF input port;
a first RF output port;
a second RF output port;
a relay having an input terminal, a first output terminal and a second output terminal;
a directional coupler having an input that is connected to the RF input port, a first output that is connected to the input terminal of the relay and a second output that is connected to the second RF output port;
a power amplifier that is provided between the first output terminal of the relay and the first RF output port; and
a termination that includes a resistive element that is coupled to the second output terminal of the relay
wherein the relay is configured so that the input of the relay is connected to the first output of the relay when a power input terminal of the relay receives electrical power, and wherein the relay is configured so that the input of the relay is connected to the termination that includes the resistive element when an electrical power feed to the power input terminal is interrupted.

18. A method of providing a non-interruptible communication path through a signal amplifier that includes an RF input port and a plurality of RF output ports, the method comprising:
using a directional coupler to split a signal received at the RF input port into a first signal component and a second signal component;
passing the first signal component to a first of the plurality of output ports via a first communication path that includes an amplifier;
passing the second signal component to a second of the plurality of output ports via a second non-interruptible communication path; and
passing the first signal component to a matched termination in response to interruption of an electrical power feed to the signal amplifier.

19. The method of claim 18, wherein the matched termination comprises a termination that includes a resistive element.

20. The method of claim 18, further comprising:
restoring the electrical power feed to the signal amplifier, and then;
passing the first signal component back to the first of the plurality of output ports via the first communication path after the power feed is restored.

21. The method of claim 18, further comprising:
passing electrical power from the power input to a power regulation circuit;
using the power regulation circuit to supply a power supply voltage; and
determining that the electrical power feed has been interrupted based on an interruption in the supply of the power supply voltage.

22. A bi-directional RF signal amplifier, comprising
an RF input port;
an RF output port;
a power input for receiving electrical power;
a first communication path between the RF input port and the RF output port, the first communication path including a power amplifier that is coupled to the power input and that is configured to amplify signals that are transmitted from the RF input port to the RF output port via the first communication path;
a second non-interruptible communication path between the RF input port and the RF output port; and
at least one circuit element that is configured to connect the RF input port to the RF output port via the first communication path when electrical power is available at the power input and to connect the RF input port to the RF output port via the second non-interruptible communication path when electrical power is unavailable at the power input, wherein the at least one circuit element comprises a switch that selectively connects the RF input port to one of the first communication path and the second non-interruptible communication path and a directional coupler that connects the first communication path and the second non-interruptible communication path to the RF output port.

23. The bi-directional RF signal amplifier of claim 22, wherein the first communication path includes a power dividing circuit having an input and a plurality of outputs, and wherein the directional coupler is between a first of the plurality of outputs of the dividing circuit and the RF output port.

24. A bi-directional RF signal amplifier, comprising
an RF input port;
a first diplexer having an input that receives signals from the first RF input port and a high frequency output and a low frequency output;
a relay having an input, a first output and a second output, wherein the input of the relay receives the high frequency output of the first diplexer;
a power amplifier having an input that is connected to the first output of the relay;
a second diplexer that includes a high frequency input that receives an output of the power amplifier and the second output of the relay and a low frequency input that receives the low frequency output of the first diplexer;
an RF output port that is coupled to an output of the second diplexer; and
a power input for receiving electrical power.

25. The bi-directional RF signal amplifier of claim 24, further comprising a second relay and a second power amplifier coupled between the low frequency input of the second diplexer and the low frequency output of the first diplexer.

26. The bi-directional RF signal amplifier of claim 24, wherein the relay and the power amplifier are implemented together as part of a single integrated circuit chip, and wherein the output of the power amplifier and the second output of the relay are combined on the integrated circuit chip so that a single pin of the integrated circuit chip is connected to the high frequency input of the second diplexer.

* * * * *

UNITED STATES PATENT AND TRADEMARK OFFICE
CERTIFICATE OF CORRECTION

PATENT NO. : 7,912,431 B2  Page 1 of 1
APPLICATION NO. : 12/208675
DATED : March 22, 2011
INVENTOR(S) : Phillips et al.

It is certified that error appears in the above-identified patent and that said Letters Patent is hereby corrected as shown below:

On the Title Page;
Item (56) References Cited,
   Page 2, Other Publications, Left Column, Line 6, "Epygi":
      Please correct "product.php-" to read -- product.php --

Other Publications: Please add the following:
      -- Signal Vision, Inc.; Signal Vision 2-Way Subscriber Amplifier,"
      specification sheet, 1 pg., Admitted Prior Art --
      and,
      -- Bypass Drop Amplifier, PCT International Product Specifications,
      info@pctintl.com --

Signed and Sealed this
Twenty-seventh Day of September, 2011

David J. Kappos
*Director of the United States Patent and Trademark Office*